United States Patent [19]
Palmour

[11] Patent Number: 5,270,554
[45] Date of Patent: Dec. 14, 1993

[54] HIGH POWER HIGH FREQUENCY METAL-SEMICONDUCTOR FIELD-EFFECT TRANSISTOR FORMED IN SILICON CARBIDE

[75] Inventor: John W. Palmour, Cary, N.C.
[73] Assignee: Cree Research, Inc., Durham, N.C.
[21] Appl. No.: 715,560
[22] Filed: Jun. 14, 1991
[51] Int. Cl.$^5$ .............. H01L 29/48; H01L 29/80; H01L 29/161; H01L 21/20
[52] U.S. Cl. .................. 257/77; 257/280; 257/284; 257/287; 257/472; 437/100
[58] Field of Search .............. 357/15, 22, 61, 55, 357/56, 63, 64, 67, 68; 437/100; 257/77, 280, 284, 287, 472

[56] References Cited

U.S. PATENT DOCUMENTS

| | | | |
|---|---|---|---|
| 4,732,871 | 3/1988 | Buchmann et al. | 437/41 |
| 4,757,028 | 7/1988 | Kondoh et al. | 437/100 |
| 4,762,806 | 8/1988 | Suzuki et al. | 437/100 |
| 4,897,710 | 1/1990 | Suzuki et al. | 357/71 |

OTHER PUBLICATIONS

Journal of Applied Physics, vol. 64 #4, pp. 2168-2177 by Palmour et al. Aug. 15, 1988.
Kong et al.; Temperature dependence of the current-voltage characteristics of metal-semiconductor field-effect transistors in n-type $\beta$-SiC grown via chemical vapor deposition; Appl. Phys. Lett. 51(6), Aug. 10, 1987.

Primary Examiner—Mark V. Prenty
Attorney, Agent, or Firm—Bell, Seltzer, Park & Gibson

[57] ABSTRACT

A high power, high frequency, metal-semiconductor field-effect transistor comprises a bulk single crystal silicon carbide substrate, an optional first epitaxial layer of p-type conductivity silicon carbide formed upon the substrate, and a second epitaxial layer of n-type conductivity silicon carbide formed upon the first epitaxial layer. The second epitaxial layer has two separate well regions therein that are respectively defined by higher carrier concentrations of n-type dopant ions than are present in the remainder of the second epitaxial layer. Ohmic contacts are positioned upon the wells for respectively defining one of the well regions as the source and the other as the drain. A Schottky metal contact is positioned upon a portion of the second epitaxial layer that is between the ohmic contacts and thereby between the source and drain for forming an active channel in the second epitaxial layer when a bias is applied to the Schottky contact.

67 Claims, 4 Drawing Sheets

HIGH POWER HIGH FREQUENCY METAL-SEMICONDUCTOR FIELD-EFFECT TRANSISTOR FORMED IN SILICON CARBIDE

This invention was made with Government support under Department of the Navy Contract No. N00014-88-K-0341/P00002. The Government has certain rights in this invention.

FIELD OF THE INVENTION

The present invention relates to high power, high frequency metal-semiconductor field-effect transistors (MESFETs), and more particularly to such transistors formed in silicon carbide.

BACKGROUND OF THE INVENTION

Electrical circuits requiring high power handling capability (>20 watts) while operating at high frequencies such as radio frequencies (500 MHz), S-band (3 GHz) and X-band (10 GHz) have in recent years become more prevalent. Because of the increase in high power, high frequency circuits there has been a corresponding increase in demand for transistors which are capable of reliably operating at radio frequencies and above while still being capable of handling higher power loads. Previously, bipolar transistors and power metal-oxide semiconductor field effect transistors (MOSFETs) have been used for high power applications but the power handling capability of such devices is generally limited at higher operating frequencies. Junction field-effect transistors (JFETs) were commonly used for high frequency applications but the power handling capability of previously known JFETs is limited.

Recently, metal-semiconductor field effect transistors (MESFETs) have been developed for high frequency applications. The MESFET construction is preferable for high frequency applications because only majority carriers carry current. The MESFET design is preferred over current MOSFET designs because the reduced gate capacitance permits faster switching times of the gate input. Therefore, although all field-effect transistors utilize only majority carriers to carry current, the Schottky gate structure of the MESFET makes the MESFET more desirable for high frequency applications.

In addition to the type of structure—and perhaps more fundamentally—the characteristics of the semiconductor material from which a transistor is formed also affects the operating parameters. Of the characteristics which affect a transistors operating parameters, the electron mobility, saturated electron drift velocity, electric breakdown field and thermal conductivity have the greatest effect on a transistor's high frequency and high power characteristics.

Electron mobility describes how strongly the motion of an electron is influenced by the application of an electric field. Thus if a particular semiconductor material has a high electron mobility, a lesser electric field is required to move the same number of electrons than is required in a material that has a lower electron mobility. In the past, semiconductor materials which have a high electron mobility were preferred because more current could be developed with a lesser field, resulting in faster response times when a field is applied.

Saturated electron drift velocity is the maximum velocity which an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents increase and the current through the field effect transistor decreases due to a decrease in carrier mobility with an increase in temperature. Therefore, if the heat is dissipated from the semiconductor the material will remain at a lower temperature and be capable of carrying larger currents with lower leakage currents.

In the past, most high frequency MESFETs have been manufactured of n-type III-V compounds, such as gallium arsenide (GaAs) because of their high electron mobilities. Although these devices provided increased operating frequencies and moderately increased power handling capability, the relatively low breakdown voltage and the lower thermal conductivity of these materials have limited their usefulness in high power applications.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-K indicate that SiC would be suitable for high frequency, high power applications. Unfortunately, difficulty in manufacturing has limited the usefulness of SiC for high power and high frequency applications.

Recently, MESFETs having channel layers of silicon carbide have been produced on silicon substrates (see U.S. Pat. Nos. 4,762,806 to Suzuki et al and 4,757,028 to Kondoh et al). Because the semiconductor layers of a MESFET are epitaxial, the layer upon which each epitaxial layer is grown affects the characteristics of the device. Thus, a SiC epitaxial layer grown on a Si substrate has different electrical and thermal characteristics then a SiC epitaxial layer grown on a different substrate. Although the SiC on Si substrate devices described in U.S. Pat. Nos. 4,762,806 and 4,757,028 may have exhibited improved thermal characteristics, the use of a Si substrate limits the ability of such devices to dissipate heat. Furthermore, the growth of SiC on Si results in defects in the epitaxial layers which result in high leakage current when the device is in operation.

Other MESFETs have been developed using SiC substrates. U.S. patent application Ser. No. 07/540,488 filed Jun. 19, 1990 and now abandoned, the disclosure of which is incorporated entirely herein by reference, describes a SiC MESFET having epitaxial layers of SiC grown on a SiC substrate. These devices exhibited improved thermal characteristics over previous devices because of the improved crystal quality of the epitaxial layers grown on SiC substrates. However, to obtain high power and high frequency, one must overcome the limitations of SiC's lower electron mobility. As such, additional development of the structure of the MESFET is required.

OBJECT AND SUMMARY OF THE INVENTION

Therefore, it is an object of the present invention to provide a MESFET that can operate at high frequencies, high power levels, and high temperatures, while taking advantage of the physical properties of silicon carbide and avoiding the problems noted in a number of the prior attempts and devices.

The invention meets this object by providing a high power, high frequency, metal-semiconductor field-effect transistor comprising a bulk single crystal silicon carbide substrate, an optional first epitaxial layer of p-type conductivity silicon carbide formed upon the substrate, and a second epitaxial layer of n-type conductivity silicon carbide formed upon the first epitaxial layer. The second epitaxial layer has two separate well regions therein that are respectively defined by higher carrier concentrations of n-type dopant ions than are present in the remainder of the second epitaxial layer. Ohmic contacts are positioned upon the wells for respectively defining one of the well regions as the source and the other as the drain. A Schottky metal contact is positioned upon a portion of the second epitaxial layer that is between the ohmic contacts and thereby between the source and drain for forming an active channel in the second epitaxial layer when a bias is applied to the Schottky contact.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
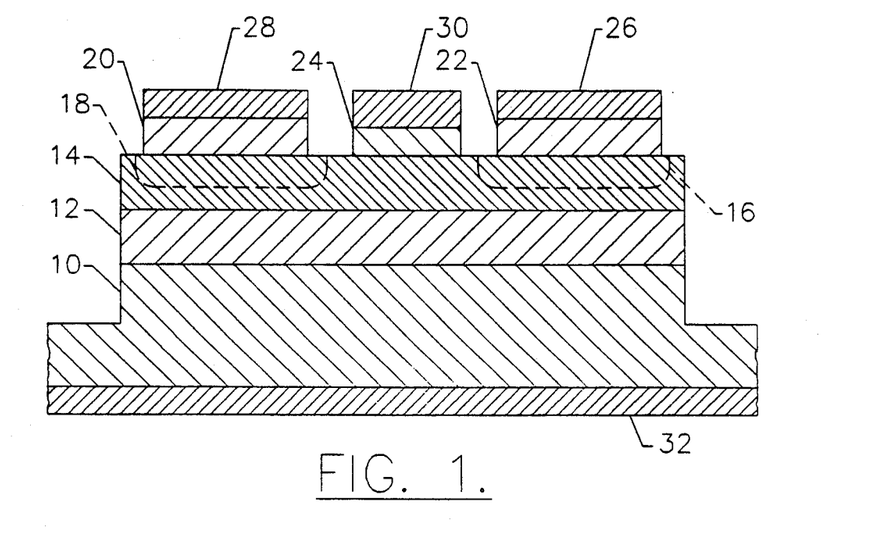
FIG. 1 is a cross-sectional view of one embodiment of the present invention having n+ wells.

FIG. 1 illustrates a first embodiment of the MESFET of the present invention. A first epitaxial layer 12 of p-type conductivity is grown on a single crystal bulk silicon carbide substrate 10 of either p-type or n-type conductivity. The first epitaxial layer of p-type conductivity silicon carbide is disposed between the substrate and an n-type epitaxial layer. A second epitaxial layer 14 of n-type conductivity is grown on the first epitaxial layer 12. Wells 16 and 18, of n+ conductivity are formed in the second epitaxial layer 14. As used herein, "n+" or "p+" refer to regions that are defined by higher carrier concentration than are present in adjacent or other regions of the same or another epitaxial layer or substrate. An optional conducting plane, 32 may be formed on the opposite side of the substrate from the first epitaxial layer 12.

Ohmic contacts 20 and 22, are formed on wells 16 and 18 to create a source contact 20 and a drain contact 22. A Schottky gate contact 24 is formed on the second epitaxial layer 14 between the source contact 20 and the drain contact 22. As illustrated, optional metal overlayers 26, 28 and 30 are formed on the source and drain contacts 20 and 22 and the Schottky gate contact 24.

Figure 2:
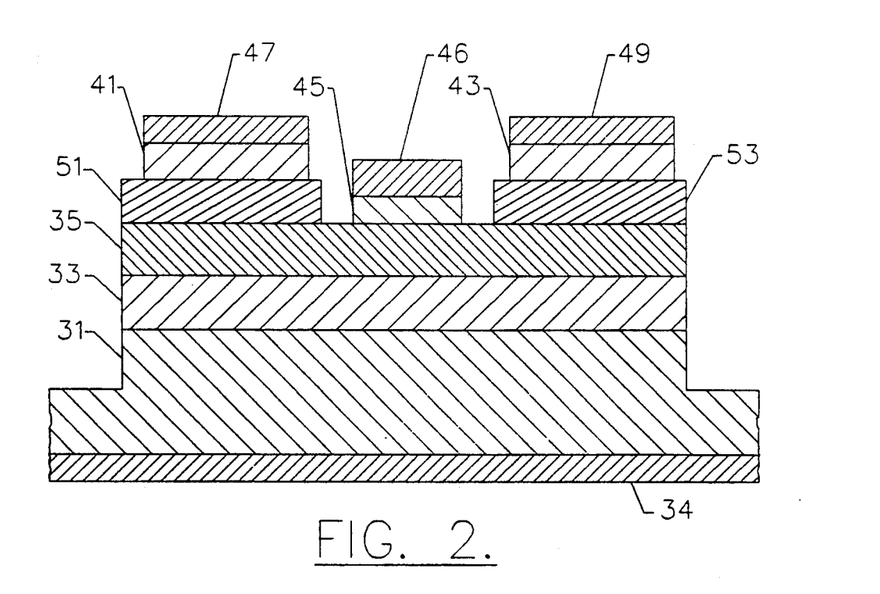
FIG. 2 is a cross-sectional view of a second embodiment of the present invention having n+ mesas.
Figure 3:
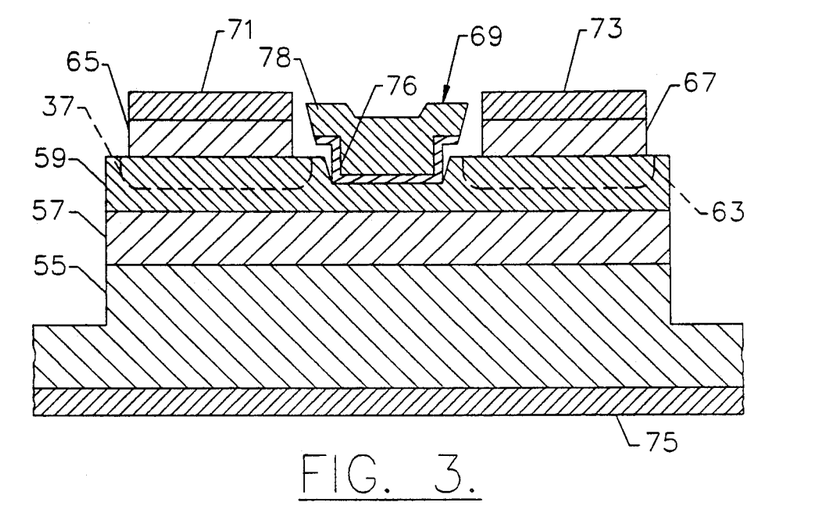
FIG. 3 is a cross-sectional view of a third embodiment of the present invention having n+ wells and a recessed mushroom gate structure.
Figure 4:
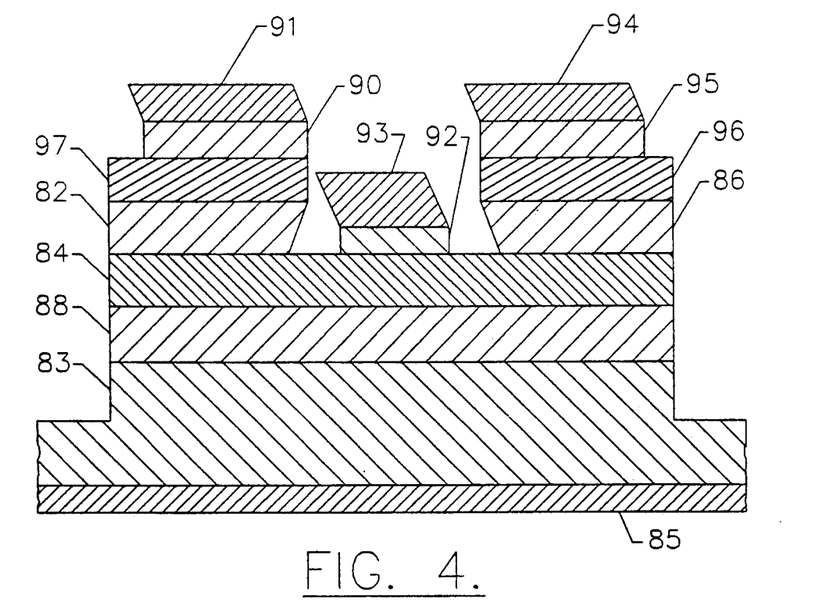
FIG. 4 is a cross-sectional view of a fourth embodiment of the present invention having n+ retrograde etched mesas and a self-aligned Schottky gate contact.

The structure of the transistor as shown in FIG. 1 and subsequent FIGS. 2 through 4, forms a mesa which defines the periphery of the device. In a device not having a p-type epitaxial layer, the substrate and the n-type epitaxial layer form a mesa having sidewalls which define the periphery of the transistor. The sidewalls of the mesa extend downward past the n-type conductivity layer of the device. Preferably, the mesa is formed to extend into the substrate of the device. The mesa extends past the depletion region of the device to confine current flow in the device to the mesa and reduce the capacitance of the device. If the depletion region of the device extends below the level of the mesa then it spreads to areas outside the mesa, resulting in larger capacitance. The mesa is preferably formed by reactive ion etching the above described device, however other methods of forming known to one skilled in the art may be used to form the mesa. Furthermore, if a mesa is not utilized the device may be isolated using other methods such as proton bombardment, counter-doping with compensating atoms or others known to one skilled in the art.

FIG. 2 illustrates a second embodiment of the MESFET according to the present invention. A first epitaxial layer 33 of p-type conductivity is grown on a single crystal bulk silicon carbide substrate 31 of either p-type or n-type conductivity. The first epitaxial layer of p-type conductivity silicon carbide is disposed between the substrate and an n-type epitaxial layer. A second epitaxial layer 35 of n-type conductivity is grown on the first epitaxial layer 33. Regions of n+ SiC are formed into mesas 51 and 53 which are located on the second epitaxial layer 35. The mesas 51 and 53 may be formed by either epitaxial growth of n+ conductivity SiC formed on the n-type conductivity epitaxial layer and then etching the third layer to form the mesas or by etching an n+ conductivity region of the n-type conductivity epitaxial layer 35 to produce mesas 51 and 53. Ohmic contacts 41 and 43, are formed on mesas 51 and 53 to create a source contact 41 and a drain contact 43. A Schottky gate contact 45 is formed on the second epitaxial layer 35 between the source contact 41 and the drain contact 43. As illustrated, an optional metal overlayer 47, 49 and 46 is formed on the source and drain contacts 41 and 43 and the gate contact 45. An optional conducting plane, 34 may be formed on the opposite side of the substrate from the first epitaxial layer 33.

FIG. 3 illustrates a third embodiment of the MESFET of the present invention where the Schottky gate contact is recessed in the active channel layer. FIG. 3 also illustrates an embodiment of the present invention where the Schottky gate contact is a mushroom gate contact. A first epitaxial layer 57 of p-type conductivity is grown on a single crystal bulk silicon carbide substrate 55 of either p-type or n-type conductivity. A second epitaxial layer 59 of n-type conductivity is grown on the first epitaxial layer 57. Wells 37 and 63, of n+ conductivity are formed in the second epitaxial layer 59. Ohmic contacts 65 and 67, are formed on wells 37 and 63 to create a source contact 65 and a drain contact 67. A portion of the second epitaxial layer 59 is removed to provide a recessed section between the source and the drain. A Schottky gate contact 69 is formed in the recessed portion of the second epitaxial layer 59 between the source contact 37 and the drain contact 63. The Schottky gate contact 69 is a mushroom structure. As used herein a mushroom gate is a gate structure which has increasing cross-sectional area as the distance from the second epitaxial layer 59 increases. As illustrated, the Schottky mushroom gate contact 69 can optionally be formed of a first gate layer of metal selected from the group of platinum, platinum silicide or gold 76 contacting the active channel layer and a second layer of gold 78 or other highly conductive metal formed on the first layer. As illustrated, an optional metal overlayer 71 and 73 is formed on the source and drain contacts 65 and 67. An optional conducting plane, 75 may be formed on the opposite side of the substrate from epitaxial layer 57.

FIG. 4 illustrates a fourth embodiment of the present invention where the source mesa 82 is a retrograde etched mesa. As use herein, a retrograde etched mesa is a mesa having the characteristic side cut which results from retrograde etching, although such a side cut may be produced using other methods known to one skilled in the art. FIG. 4 further illustrates an embodiment of the present invention where the Schottky gate contact is a self-aligned gate contact, thereby allowing the gate to be positioned as close as possible to the source. A first epitaxial layer 88 of p-type conductivity is grown on a single crystal bulk silicon carbide substrate 83 of either p-type or n-type conductivity. A second epitaxial layer 84 of n-type conductivity is grown on the first epitaxial layer 88. Regions of n+ SiC are formed into mesas 82 and 86 which are located on the second epitaxial layer 84. The mesas 82 and 86 may be formed by either epitaxially growing a third epitaxial layer of n+ SiC and then etching the third layer to form the mesa or by ion implantation of a thickened second epitaxial layer 84 and followed by etching the second epitaxial layer to produce mesas 82 and 86. Ohmic contacts 97 and 96, are formed on mesas 82 and 86 to create a source contact 97 and a drain contact 96. A Schottky gate contact 92 is formed on the second epitaxial layer 84 between the source contact 97 and the drain contact 96. Layers of gate material 90 and 95 may optionally form on a portion of the source contact 97 and the drain contact 96. As illustrated, an optional metal overlayer 91, 94 and 93 is formed on deposited gate material 90 and 95, and the gate contact 92. An optional conducting plane, 85 may be formed on the opposite side of the substrate from the first epitaxial layer 88.

In each of the embodiments described above, the substrate is formed of silicon carbide selected from the group of 6H, 4H, 15R or 3C silicon carbide and the epitaxial layers are formed of silicon carbide selected from the group of 6H, 4H, 15R or 3C silicon carbide. The substrate 10, 31, 55 and 83 is formed of single crystal bulk silicon carbide of 6H, 4H, 15R or 3C polytype and may be either p-type or n-type conductivity. The first epitaxial layers 12, 33, 57 and 88 are formed of p-type conductivity silicon carbide of 6H, 4H, 15R or 3C polytype. Carrier concentrations of up to about $3 \times 10^{17}$ cm$^{-3}$ are suitable for the first epitaxial layer however carrier concentrations of about $3 \times 10^{16}$ or less are preferred. Suitable dopants include aluminum, boron and gallium. The second epitaxial layers 14, 35, 59 and 84 are formed of n-type conductivity silicon carbide of 6H, 4H, 15R or 3C polytype. N-type carrier concentrations of the n-type epitaxial layer from about $2 \times 10^{16}$ to about $2 \times 10^{18}$ cm$^{-3}$ are suitable. Suitable dopants include nickel and phosphorous. For the n+ regions of the transistors described above, carrier concentrations of about $5 \times 10^{17}$ are suitable but carrier concentrations of about $2 \times 10^{18}$ or higher are preferred. The ohmic contacts 20, 41, 65, 22, 43, 67, 97 and 96 are preferably formed of nickel or other suitable metals. The Schottky gate contacts 24, 45, 69 and 92 are preferably formed of platinum or platinum silicide, however other metals such as gold, known to one skilled in the art to achieve the Schottky effect may be used. The above described devices optionally have an overlay upon the ohmic contacts and the gate contact, the overlayer 26, 30, 47, 71, 28, 46, 49, 73, 91, 94, and 93 being comprised of gold, silver, aluminum, platinum and copper. Other suitable highly conductive metals may also be used for the overlayer. The above described devices may also have a passivating layer (not shown) which covers exposed areas of the n-type conductivity layers, the sidewalls of the mesas and any exposed substrate of p-type conductivity layers. The passivating layer may optionally be selectively located on all non-metal surfaces of the device. A passivating layer of silicon dioxide is preferred but other materials known to one skilled in the art may be used.

The thickness of the n-type conductivity region beneath the gate contact defines the cross-sectional height of the channel region of the device and is selected based Ion the desired pinch-off voltage of the device and the carrier concentration. Given the carrier concentration of the second epitaxial layer, the depth of the layer required for a given pinch-off voltage may be readily calculated using methods known to one skilled in the art. Accordingly, it is desirable for the thickness and carrier concentration of the n-type epitaxial layer to be selected to provide a pinch-off voltage of from between about $-3$ volts and $-20$ volts, but preferably between about $-5$ volts and $-15$ volts. For a device utilizing an n-type substrate, the thickness of the buried p-type conductivity layer of the above described devices must be sufficiently thick so that breakdown of the gate junction occurs before the depletion of the p-type conductivity layer. For a device utilizing an p-type substrate, the thickness of the buried p-type conductivity layer and the substrate of the above described devices must be sufficient thick so that breakdown of the gate junction occurs before the depletion of the p-type conductivity layer and the substrate.

The above descriptions describe the preferred embodiments of the present invention, however, the first epitaxial layer described above may optionally be eliminated and thereby forming a transistor having a single epitaxial layer of n-type conductivity SiC formed on either a semi-insulating substrate or a p-type substrate. In forming a single epitaxial layer device, the substrate of the device it is preferable to utilize either p-type conductivity silicon carbide having the carrier concentrations as described for the p-type buried layer or a semi-insulating substrate.

The above described MESFET structures result in transistors capable of operating at frequencies of up to 1.9 GHz. Additional performance can be achieved by selecting the gate and source dimensions of the above described MESFET structures to minimize the effect of the relatively low electron mobility of SiC while maximizing the benefits of the relatively high saturated electron drift velocity and breakdown voltage of SiC.

In selecting the dimensions of the MESFET, the width of the gate is defined as the dimension of the gate perpendicular to the flow of current. As shown in the cross-sections, FIGS. 1 through 3, the gate width runs into and out of the page. The length of the gate is the dimension of the gate parallel to the flow of current. As seen in the cross-sectional views of FIGS. 1 through 4, the gate length is the dimension of the gate 24, 45, 69 and 92 which is in contact with the second epitaxial layer 14, 35, 59 and 84. A third important dimension is the source to gate distance which is shown in the cross-sections, FIG. 1 through 4, as the distance from the n+ wells or mesa to the gate contact 24, 45, 69 and 92.

To minimize the effect of low electron mobility, the source to gate distance should be as small as possible without allowing substantial source to gate leakage current. In one embodiment of the present invention, the distance from the source to the Schottky gate contact is large enough to prevent the flow of any substantial leakage current from the source to the gate when a bias is applied to the gate while small enough to minimize the effect of the low electron mobility of silicon carbide. This typically means that the gate contact should be as close to the source contact without coming into contact with the source contact or the n+ source mesa or well. Positioning the gate as close as possible to the source region maximizes the electric field intensity in the region of the transistor where the electrons are accelerated and thereby reduces the effect of low electron mobility of SiC. Typically, the distance from the source to the Schottky contact of about 1 $\mu$m or less, is desirable. The gate to drain distance of the device should be large enough to support the gate to drain depletion spread of the device. These distances are typically from about 0.5 $\mu$m to about 2 $\mu$m.

In one embodiment of the present invention, the Schottky metal gate contact has a width and length that are selected such that the power reflected into the source and the drain contacts is substantially zero when a voltage is applied across the source and the drain contacts and a bias is applied to the Schottky metal gate contact.

To further minimize the effect of low electron mobility, the length of the gate contact should be as small as possible. Typically, Schottky gate lengths of less than about 1.5 $\mu$m are desirable. By minimizing the length of the gate, the intensity of the electric field beneath the gate is increased. The increase in electric field results because the same voltage is placed across a smaller area. This increase in electric field intensity increases the acceleration of the electrons in the gate area and thereby reduces the effects of the low electron mobility of silicon carbide. Thus, it is desirable to minimize the length of the gate and thereby maximize the intensity of the electric field beneath the gate.

To allow for higher power handling capability the width of the gate contact should be as large as possible. However, as the length of the gate decreases and the width of the gate increases the output impedance of the transistor decreases. The decrease in output impedance can affect the ability of the transistor to operate at high frequencies as impedance matching problems can result. When a transistor having a characteristic output impedance is connected to a circuit having a characteristic input impedance, a portion of the power incident upon the inputs of the circuit is reflected back into the transistor. The amount of the total power transferred from the transistor and the amount reflected to the transistor is determined by the difference between the input impedance of the circuit and the output impedance of the transistor. If the two impedances are matched, all of the power is transferred from the transistor. The two impedances can be essentially matched by use of a matching circuit or other means known to one skilled in the art. The transistor is impedance matched to the circuit when the power reflected from the transistor is substantially zero and thus substantially all of the power is transferred from the transistor. As used herein, the power reflected from the transistor is substantially zero when less than about 10 percent of the power is reflected into the transistor. Therefore, the gate length is to be made as narrow as possible and the gate width as wide as possible without causing impedance matching problems at the desired operating frequencies. This combination of gate lengths and widths result in a transistor with the maximum power handling capability for the desired operating frequency range. Typically, output impedances of greater than about 50 ohms are desirable however, output impedances of from as low as about 1 ohm to about 10 ohms may be utilized, although matching to low impedances can only be achieved over a narrow bandwidth. The length and width of the Schottky gate contact can be selected to minimize the reflection of power while operating at frequencies from about 0.5 GHz to about 30 GHz.

In addition to the above embodiments, a decrease in the leakage current through the first epitaxial layer 12, 33, 57 and 88 at pinch-off conditions results from doping the first epitaxial layer to create a semi-insulating layer. Accordingly, it is desirable if the first epitaxial layer is formed of semi-insulating silicon carbide. Alternatively, if no p-type epitaxial layer is present, it is desirable for the substrate to be formed of semi-insulating silicon carbide. Additionally, both the first epitaxial layer and the substrate may be formed of semi-insulating silicon carbide. The first epitaxial layer 12, 33, 57 and 88 may be doped with a deep level dopant such as boron to create a semi-insulating layer. By creating a layer of SiC having a resistivity of about 10,000 ohm-cm or greater, the leakage current through the first epitaxial layer, 12, 33, 57 and 88, is greatly reduced. However, any increase in the resistivity of the first epitaxial layer is desirable and would result in a decrease in the leakage current through the first epitaxial layer. A semi-insulating layer may be formed from SiC doped with boron. A semi-insulating layer is preferably created through epitaxial incorporation of deep level dopants into SiC, however other methods such as ion implantation, proton bombardment or other methods of forming a semi-insulating silicon carbide layer known to one skilled in the art may used.

Figure 5:
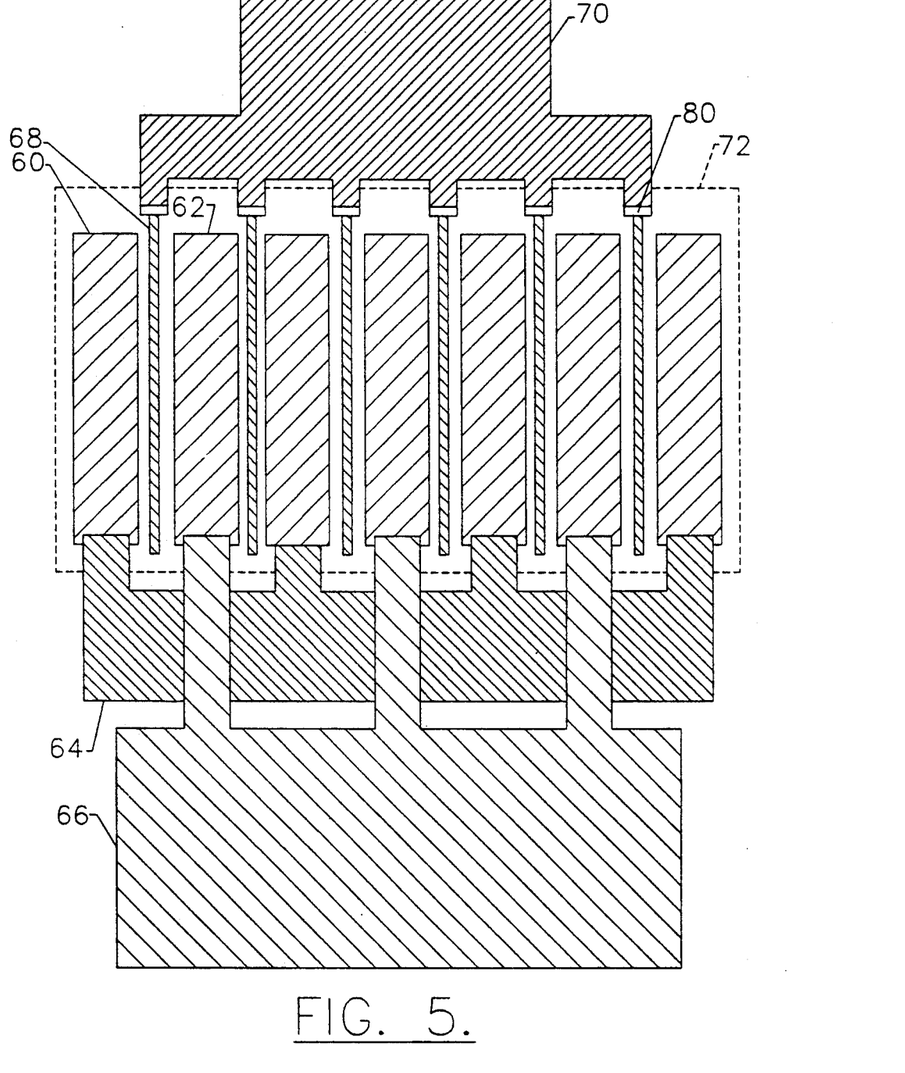
FIG. 5 is plan view of a high power interdigitated structure according to the present invention.

FIG. 5 illustrated a high power structure of the present invention. The structure shown in FIG. 5 is an interdigitated structure having a plurality of source regions 60 and drain regions 62. The source and drain regions 60 and 62 are fabricated of ohmic contact metals such as Ni and form the ohmic contacts of the transistor. Source and drain regions 60 and 62 are interconnected by a source contact 64 and a drain contact 66 which may be formed of highly conductive metals such as aluminum, silver, gold, platinum, copper or others. The Schottky gate contacts 68 lie between each source region 60 and drain region 62. The Schottky gate contacts 68 are formed from suitable Schottky metals such as platinum, platinum silicide, gold or others. The gate contacts 68 are connected by contact pads 80, which are also formed of suitable Schottky metals, to the gate interconnect 70. Optionally, an overlayer of highly conductive metal such as aluminum, silver, gold, platinum, copper or others may be formed on the Schottky metal contact. The gate interconnect may be made of any suitable highly conductive metal such as aluminum, silver, gold, platinum, copper or others and need not be the same as the gate overlay metal. The gate 68, source 60 and drain 62 regions are all formed on an n-channel mesa 72. Each of the contact areas are formed on a deposited insulator and are positioned off of the n-channel mesa 72. Also, the source and drain interconnects are separated by a deposited insulator. Either of the above described structures employing n+ mesas or wells may be employed for forming drain and source regions in the interdigitated structure shown in FIG. 4. The length and number of gate digits 68 is selected based upon the desired operating frequencies and power range. Large gate widths can result in degradation because of distributed transmission line effects. Because of the distributed transmission line effects it is desirable that the length of the digits of the structure be less than about 1/20th of the wavelength of the intended operating frequency. Thus, for example, digits of 2 mm for 500 MHz, 250 μm for 10 GHz, etc... are desirable. Having defined the length of the digits then their number is limited by the above considerations. The number of digits and gate lengths are limited, as described above, by the input impedance of the resulting transistor. Therefore, the gate lengths and number of digits should be selected to minimize the impedance matching problems for the desired operating frequency. Using the interdigitated structure, output powers of from about 630 W at 500 MHz, 158 W at 3 GHz, to about 45 W at 10 GHz can be obtained. Output powers of approximately 5 times the power level achieved by Si and GaAs devices with similar dimensions for any given operating frequency range up to 20 GHz can be obtained.

The invention and its advantages will be further understood through the following examples:

EXAMPLE I

The substrates for these transistors were sliced from 6H-SiC single crystal boules. The boules were lightly nitrogen doped and n-type. The boules were sliced, lapped and polished into wafers suitable for epitaxial growth. Thin films of monocrystalline 6H-SiC (0001), both p- and n-type, were epitaxially grown on these n-type 6H-SiC (0001) wafers. The MESFET, shown in cross-section in FIG. 2, consisted of a 2 μm thick p-type epitaxial layer of 6H-SiC having a carrier concentration in the range of $1-2 \times 10^{16}$ cm$^{-3}$ grown on the n-type 6H-SiC substrate. This p-type layer acted as the buried layer to confine the current to a thin n-type active region which was subsequently grown. This top epitaxial layer had a carrier concentration in the range of $9 \times 10^{16}$ cm$^{-3}$ and a thickness of about 0.32 μm.

The design of the high power, high frequency SiC MESFET uses a 1 mm gate width consisting of two 500 μm long gate fingers. Gate lengths varied from 0.6 μm to 1.5 μm to allow higher drain voltages. The source-gate spacing was 1 μm for all of the devices except the smallest gate length, which had about a 0.5 μm spacing. To minimize the gate capacitance, the gate contact pad area was 100 μm in diameter and placed on a deposited insulator. Source and drain metal overlayers were used to facilitate better contacting for probing as well as wire bonding.

Devices were fabricated using both wells and mesas. The fabrication of these devices was as follows. The entire device was first isolated on a mesa. Using conventional photolithography techniques, a sputtered aluminum film was patterned onto the SiC surface, which acted as a mask for the reactive ion etching of the isolation mesa. The material around the mesa was etched sufficiently deeply enough to penetrate through the top n-type layer into the buried p-type layer. The Al was then stripped, and polysilicon was deposited and patterned, opening windows for the source and drain pattern. The samples were then ion implanted with N+ to form n+ source and drain wells, using the polysilicon as the implant mask. The implants were subsequently annealed and the samples oxidized to grow a thin passivating layer of $SiO_2$. A 500 nm thick layer of $SiO_2$ was then deposited, using a low temperature chemical vapor deposition process, over the thin thermal oxide. This layer was patterned to form the center gate contact isolation pad and interconnect bars. Windows for the source and drain contacts were then opened in the $SiO_2$, and the Ni ohmic contacts were deposited and patterned using the "liftoff" technique. After these ohmic contacts were annealed, the fine line platinum Schottky gate contact with a 0.75 μm gold overlayer was patterned using an excimer laser stepper. Finally, the gate contact pad metallization was deposited and patterned on the $SiO_2$ isolation pad.

Devices utilizing a mesa source and drain structure were produced as follows. After epitaxial growth of the n-type channel layer, another n-type layer with heavy nitrogen doping was grown on top. This layer typically had a thickness of 0.2 μm and a doping of $1 \times 10^{19}$ cm$^{-3}$. The source and drain were defined by reactive ion etching the n+ layer away except where the source and drain contacts were to go, using the same mask as was used for the ion implants. The insulator layers and gate contacts were then deposited on the etched channel layer, just as was done for the devices previously discussed.

EXAMPLE II

Figure 6:
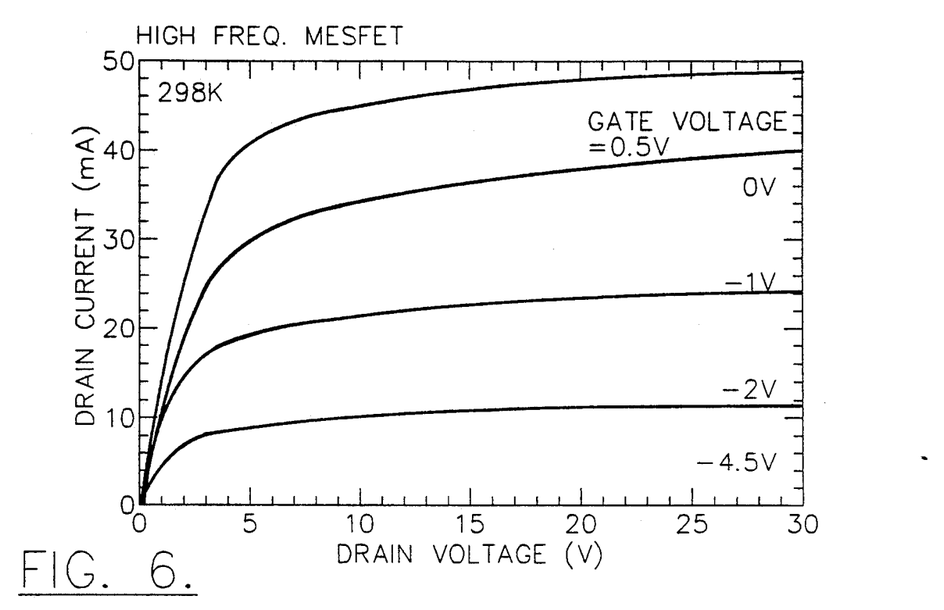
FIG. 6 is a graph of the drain current-voltage characteristics of a device of the present invention.

FIG. 6 shows the DC current-voltage plot of a 6H-SiC MESFET. The gate metal was platinum. This device had a gate length and width of 0.7 μm and 1 mm, and gold overlayer of 750 nm. This device showed good current saturation out to 35 V and a non-destructive breakdown of the SiC at $V_D = 37$ V. The maximum current for this device was 50 mA. The pinch-off voltage of the device was $V_G = -4.5$ V and the measured source-drain resistance was 67Ω. The maximum transconductance of this device was 19 mS/mm at $V_G = 0$ V. The gate leakage current at $V_G = 0$ V and $V_D = 33$ V was 385 μA, and increased to 800 μA at $V_G = -4.5$ V.

This device was measured at high frequency using an HP 8510 automatic network analyzer with a Cascade Microprober for standard S-parameter measurements.

Figure 7:
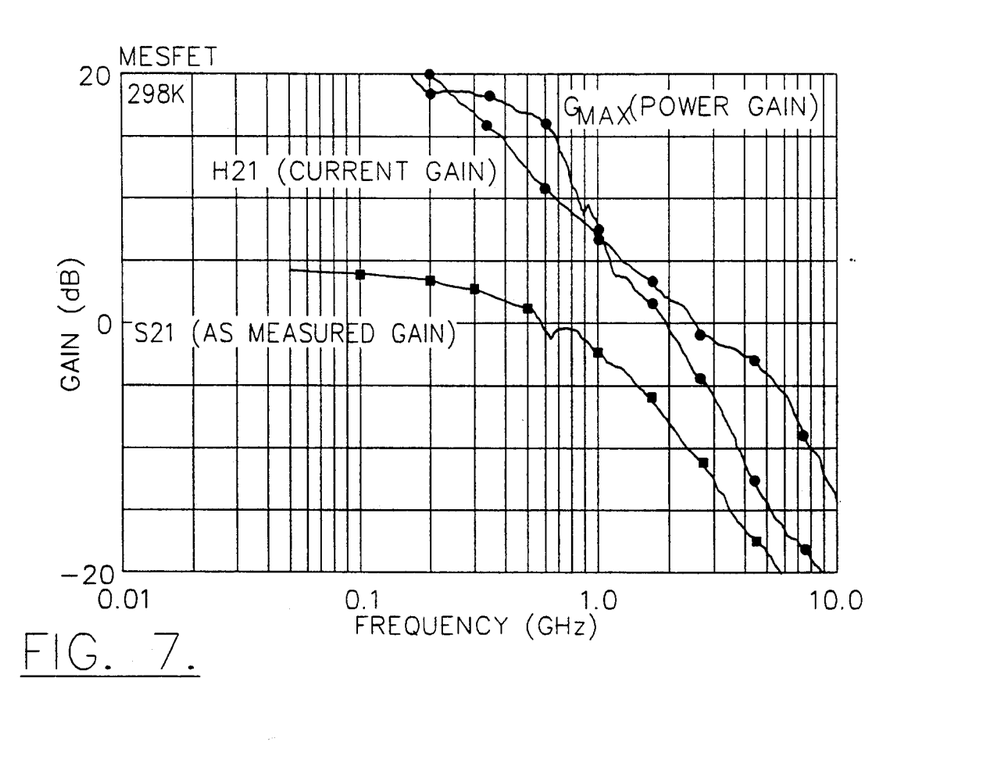
FIG. 7 is a graph of the high frequency parameters of a device of the present invention.

A gain vs. frequency plot for the device in FIG. 6 is shown in FIG. 7. The threshold frequency ($F_t$) of the device was 2.4 GHz. The $F_{max}$ of the device was 1.9 GHz. The device in FIG. 6 had a power gain of 7.0 db and a current gain of 7.0 dB at 1.0 GHz.

That which is claimed is:

1. A high power, high frequency, metal-semiconductor field-effect transistor comprising:

a bulk single crystal silicon carbide substrate;

an n-type epitaxial layer of n-type conductivity silicon carbide upon said substrate, two separate well regions in said epitaxial layer that are respectively defined by higher n-type carrier concentrations than are present in the remainder of said epitaxial layer;

a p-type epitaxial layer of p-type conductivity silicon carbide between said substrate and said n-type epitaxial layer;

ohmic contacts upon said well regions in said n-type epitaxial layer for respectively defining one of said well regions as the source and the other of said well regions as the drain;

a Schottky metal contact upon a portion of said n-type epitaxial layer that is between said ohmic contacts and thereby between said source and said drain for forming an active channel in said n-type epitaxial layer between said source and said drain when a bias is applied to said Schottky metal contact; and a conducting plane formed on said substrate opposite said p-type epitaxial layer.

2. A transistor according to claim 1 wherein said substrate is formed of silicon carbide selected from the group consisting of 6H, 4H, 15R or 3C silicon carbide, said n-type epitaxial layer is formed of silicon carbide selected from the group consisting of 6H, 4H, 15R or 3C silicon carbide and said p-type epitaxial layer is formed of silicon carbide selected from the group consisting of 6H, 4H, 15R or 3C silicon carbide.

3. A transistor according to claim 1 wherein the distance from said source to said Schottky metal contact is large enough to prevent the flow of any substantial leakage current from the source to the gate when a bias is applied to the gate while small enough to minimize the effect of the low electron mobility of silicon carbide.

4. A transistor according to claim 1 further comprising an overlayer upon said ohmic contacts and said Schottky metal contact, wherein said overlayer is a metal selected form the group consisting of gold, silver, aluminum, platinum and copper.

5. A transistor according to claim 1 wherein said Schottky metal contact has a width and length that have complimentary dimensions such that the power reflected into said source and said drain contacts is substantially zero when a voltage is applied across said source and said drain contacts and a bias is applied to said Schottky metal contact.

6. A high power, high frequency, metal-semiconductor field-effect transistor comprising:

a bulk single crystal silicon carbide substrate;

a first epitaxial layer of p-type conductivity silicon carbide on said substrate;

a second epitaxial layer of n-type conductivity silicon carbide upon said first epitaxial layer, wherein said epitaxial layers form a mesa having sidewalls extending downward from said second epitaxial layer into said first epitaxial layer which define the periphery of said transistor;

two separate well regions in said second layer that are respectively defined by higher n-type carrier concentrations than are present in the remainder of said second epitaxial layer;

ohmic contacts upon said well regions in said second epitaxial layer for respectively defining one of said well regions as the source and the other of said well regions as the drain; and a Schottky metal contact upon a portion of said second epitaxial layer that is between said ohmic contacts and thereby between said source and said drain for forming an active channel in said second epitaxial layer between said source and said drain when a bias is applied to said Schottky metal contact.

7. A transistor according to claim 6 wherein said substrate is formed of silicon carbide selected from the group of 6H, 4H, 15R or 3C silicon carbide, said first epitaxial layer is formed of silicon carbide selected from the group of 6H, 4H, 15R or 3C silicon carbide and said second epitaxial layer is formed of silicon carbide selected from the group of 6H, 4H, 15R or 3C silicon carbide.

8. A transistor according to claim 6 wherein the distance from said source to said Schottky metal contact is large enough to prevent the flow of any substantial leakage current from the source to the Schottky metal contact when a bias is applied to the Schottky metal contact while small enough to minimize the effect of the low electron mobility of silicon carbide.

9. A transistor according to claim 6 wherein said Schottky metal contact is recessed in said active channel portion of said n-type epitaxial layer.

10. A transistor according to claim 6 wherein said Schottky metal contact is a mushroom gate contact.

11. A transistor according to claim 6 further comprising an overlayer upon said ohmic contacts, wherein said overlayer is a metal selected from the group consisting of gold, silver, aluminum, platinum and copper.

12. A transistor according to claim 6 further comprising an overlayer upon said Schottky metal contact, wherein said overlayer is a metal selected from the group consisting of gold, silver, aluminum, platinum and copper.

13. A transistor according to claim 6 wherein said mesa further comprises said substrate and said sidewalls of said mesa extend downward into said substrate.

14. A transistor according to claim 6 wherein said Schottky metal contact has a width and length that have complimentary dimensions such that the power reflected into said source and said drain contacts is substantially zero when a voltage is applied across said source and said drain contacts and a bias is applied to said Schottky metal contact.

15. A transistor according to claim 6 wherein the length of said Schottky metal contact is less than about 2.0 microns.

16. A transistor according to claim 6 wherein the distance from said source to said Schottky metal contact is about 2.0 microns or less.

17. A transistor according to claim 6, further comprising a conducting plate formed on said substrate opposite said first epitaxial layer.

18. A transistor according to claim 6 wherein the length and width of said Schottky metal contact is selected to minimize reflection of power while operating at frequencies from about 0.5 GHz to about 30 GHz.

19. A transistor according to claim 6 wherein the n-type carrier concentration of said n-type epitaxial layer is from between about $2\times10^{16}$ and $2\times10^{18}$ cm$^{-3}$.

20. A transistor according to claim 6 wherein said Schottky metal contact is a mushroom gate comprising:
   a first gate layer of metal selected from the group consisting of gold, platinum and platinum silicide contacting said second epitaxial layer; and
   an overlayer on said first gate layer of metal and comprising a metal selected from the group consisting of gold, silver, aluminum, platinum and copper.

21. A transistor according to claim 6 wherein said first epitaxial layer comprises semi-insulating silicon carbide.

22. A transistor according to claim 6 wherein said substrate comprises semi-insulating silicon carbide.

23. A transistor according to claim 6 wherein the thickness and carrier concentration of said n-type epitaxial layer is selected to provide a pinch-off voltage of from about −3 volts to about −20 volts.

24. A transistor according to claim 21 wherein said semi-insulating silicon carbide comprises silicon carbide with a deep level dopant incorporated therein.

25. A transistor according to claim 24 wherein said deep level dopant is boron.

26. A transistor according to claim 21 wherein said semi-insulating layer has a resistance of greater than about 10,000 Ω-cm.

27. A high power, high frequency, metal-semiconductor field-effect transistor comprising:
   a bulk crystal silicon carbide substrate;
   an epitaxial layer of n-type silicon carbide formed on said substrate;
   a pair of mesas of n-type conductivity silicon carbide on said n-type epitaxial layer, said mesas having higher n-type carrier concentrations than said n-type epitaxial layer;
   ohmic contacts upon said mesas for respectively defining one of said mesas as the source and the other of said mesas as the drain; and
   a Schottky metal contact upon a portion of said epitaxial layer that is between said mesas and thereby between said source and said drain for forming an active channel in said n-type epitaxial layer between said source and said drain when a bias is applied to said Schottky metal contact.

28. A transistor according to claim 27 where said mesas respectively comprise a layer of n+ conductivity SiC on said n-type conductivity epitaxial layer.

29. A transistor according to claim 28 wherein said n+ conductivity layer is an epitaxial layer.

30. A transistor according to claim 27 where said substrate and said n-type epitaxial layer form a mesa having sidewalls which define the periphery of said transistor, said sidewalls of said mesa extending downward into said substrate.

31. A transistor according to claim 27 wherein said substrate is silicon carbide selected from the group consisting of 6H, 4H, 15R or 3C silicon carbide and said epitaxial layer is silicon carbide selected from the group consisting of 6H, 4H, 15R or 3C silicon carbide.

32. A transistor according to claim 27 wherein the distance from said source to said Schottky metal contact is large enough to prevent the flow of any substantial leakage current from the source to the gate when a bias is applied to the gate while small enough to minimize the effect of the low electron mobility of silicon carbide.

33. A transistor according to claim 27 further comprising a conducting plane on said substrate opposite said epitaxial layer.

34. A high power, high frequency, metal-semiconductor field-effect transistor according to claim 27 wherein said Schottky metal contact has a width and length that have complimentary dimensions such that the power reflected into said source and said drain contacts is substantially zero when a voltage is applied across said source and said drain contacts and a bias voltage is applied to said Schottky metal contact.

35. A transistor according to claim 27 further comprising an overlayer upon said ohmic contacts and said Schottky metal contact, wherein said overlayer is a metal selected from the group consisting of aluminum, silver, gold, platinum and copper.

36. A transistor according to claim 27 wherein said substrate is semi-insulating silicon carbide.

37. A high power, high frequency, metal-semiconductor field-effect transistor comprising:
   a bulk crystal silicon carbide substrate;
   a first epitaxial layer of p-type conductivity silicon carbide on said substrate;
   a second epitaxial layer of n-type silicon carbide on said first epitaxial layer;
   a pair of mesas of n-type conductivity silicon carbide on said n-type second epitaxial layer, said mesas having higher n-type carrier concentrations than said n-type second epitaxial layer;
   ohmic contacts upon said mesas for respectively defining one of said mesas as the source and the other of said mesas as the drain; and
   a Schottky metal contact upon a portion of said second epitaxial layer that is between said mesas and thereby between said source and said drain for forming an active channel in said n-type epitaxial layer between said source and said drain when a bias is applied to said Schottky metal contact.

38. A transistor according to claim 37 where said mesas respectively comprise a layer of n+ conductivity SiC on said n-type conductivity epitaxial layer.

39. A transistor according to claim 38 wherein said n+ conductivity layer is an epitaxial layer.

40. A transistor according to claim 37 where said substrate and said n-type epitaxial layer form a mesa having sidewalls which define the periphery of said transistor, said sidewalls of said mesa extending downward into said first epitaxial layer.

41. A transistor according to claim 40 where said sidewalls of said mesa extend downward into said substrate.

42. A transistor according to claim 37 wherein said substrate is silicon carbide selected from the group consisting of 6H, 4H, 15R or 3C silicon carbide, said first epitaxial layer is silicon carbide selected from the group consisting of 6H, 4H, 15R or 3C silicon carbide and said second epitaxial layer is silicon carbide selected from the group consisting of 6H, 4H, 15R or 3C silicon carbide.

43. A transistor according to claim 37 wherein the distance from said source to said Schottky metal contact is large enough to prevent the flow of any substantial leakage current from the source to the gate when a bias is applied to the gate while small enough to minimize the effect of the low electron mobility of silicon carbide.

44. A transistor according to claim 37 wherein said Schottky metal contact is recessed in said active channel portion of said second epitaxial layer.

45. A transistor according to claim 37 wherein said source mesa is a retrograde etched mesa.

46. A transistor according to claim 37 further comprising a conducting plate on said substrate opposite said first epitaxial layer.

47. Transistor according to claim 37 wherein said Schottky metal contact has a width and length that have complimentary dimensions such that the power reflected into said source and said drain contacts is substantially zero when a voltage is applied across said source and said drain contacts and a bias voltage is applied to said Schottky metal contact.

48. A transistor according to claim 37 wherein the distance from said source to said Schottky metal contact is about 2.0 microns or less.

49. A transistor according to claim 37 wherein the length of said Schottky metal contact is less than about 2.0 microns.

50. A transistor according to claim 47 wherein the length and width of said Schottky metal contact minimize the reflection of power while operating at frequencies from about 0.5 GHz to about 30 GHz.

51. A transistor according to claim 37 wherein the n-type carrier concentration of said n-type epitaxial layer is from about $2 \times 10^{16}$ to about $2 \times 10^{18}$ cm$^{-3}$.

52. A transistor according to claim 37 further comprising an overlayer upon said ohmic contacts, said overlayer is a metal selected from the group consisting of aluminum, silver, gold, platinum and copper.

53. A transistor according to claim 37 further comprising an overlayer upon said Schottky metal contact, wherein said overlayer is a metal selected from the group consisting of aluminum, silver, gold, platinum and copper.

54. A transistor according to claim 37 wherein said first epitaxial layer is semi-insulating silicon carbide.

55. A transistor according to claim 37 wherein said substrate is semi-insulating silicon carbide.

56. A transistor according to claim 37 wherein the thickness and carrier concentration of said n-type epitaxial layer is selected to provide a pinch-off voltage of between about −3 volts and −20 volts.

57. A transistor according to claim 54 wherein said semi-insulating silicon carbide is silicon carbide with a deep level dopant incorporated therein.

58. A transistor according to claim 57 wherein said deep level dopant is boron.

59. A transistor according to claim 54 wherein said semi-insulating silicon carbide has a resistivity of greater than about 10,000 Ω-cm.

60. A high power, high frequency, metal-semiconductor field-effect transistor comprising:
bulk single crystal silicon carbide substrate;
a first epitaxial layer of silicon carbide having a p-type conductivity formed upon said substrate;
a second epitaxial layer of n-type conductivity silicon carbide formed upon said first epitaxial layer,
said second epitaxial layer having a plurality of well regions therein that are respectively defined by higher n-type carrier concentrations than are present in the remainder of said second epitaxial layer;
ohmic contacts upon said plurality of well regions in said second epitaxial layer for alternately electrically connecting said plurality of said well regions defining an alternating plurality of source regions and drain regions;
a plurality of electrically connected Schottky metal contacts for forming a plurality of active channels in said second epitaxial layer between said plurality of source regions and said plurality of drain regions when a bias is applied to said Schottky metal contacts, each of said Schottky metal contacts being formed upon a portion of said second epitaxial layer that is between one of said source regions and one of said drain regions.

61. A high power, high frequency, metal-semiconductor field-effect transistor comprising:
a bulk single crystal silicon carbide substrate;
a first epitaxial layer silicon carbide having a p-type conductivity formed upon said substrate;
a second epitaxial layer of n-type conductivity silicon carbide formed upon said first epitaxial layer,
a plurality of mesas on said second epitaxial layer, said mesas having higher n-type carrier concentrations than are present in said second epitaxial layer;
ohmic contacts upon said plurality of mesas for alternately electrically connecting said plurality of said mesas defining an alternating plurality of source mesas and drains mesas;
a plurality of electrically connected Schottky metal contacts formed upon said second epitaxial layer for forming a plurality of active channels in said second epitaxial layer between said plurality of source mesas and said plurality of drain mesas when a bias is applied to said Schottky metal contacts, each of said plurality of Schottky metal contacts positioned between one of said source mesas and one of said drain mesas.

62. A high power, high frequency, metal-semiconductor field-effect transistor comprising:
a bulk single crystal semi-insulating silicon carbide substrate;
an epitaxial layer of n-type conductivity silicon carbide upon said substrate,
two separate well regions in said epitaxial layer that are respectively defined by higher n-type carrier concentrations than are present in the remainder of said epitaxial layer;
ohmic contacts upon said well regions in said epitaxial layer for respectively defining one of said well regions as the source and the other of said well regions as the drain; and
a Schottky metal contact upon a portion of said epitaxial layer that is between said ohmic contacts and thereby between said source and said drain for forming an active channel in said epitaxial layer between said source and said drain when a bias is applied to said Schottky metal contact.

63. A transistor according to claim 62 wherein said substrate is formed of silicon carbide selected from the group consisting of 6H, 4H, 15R or 3C silicon carbide and said epitaxial layer is formed of silicon carbide selected from the group consisting of 6H, 4H, 15R or 3C silicon carbide.

64. A high power, high frequency, metal-semiconductor field-effect transistor comprising:
a bulk single crystal silicon carbide substrate;
an epitaxial layer of n-type conductivity silicon carbide upon said substrate,
two separate well regions in said epitaxial layer that are respectively defined by higher n-type carrier concentrations than are present in the remainder of said epitaxial layer;

ohmic contacts upon said well regions in said epitaxial layer for respectively defining one of said well regions as the source and the other of said well regions as the drain;

a Schottky metal contact upon a portion of said epitaxial layer that is between said ohmic contacts and thereby between said source and said drain for forming an active channel in said epitaxial layer between said source and said drain when a bias is applied to said Schottky metal contact; and a conducting plane formed on said substrate opposite said epitaxial layer.

65. A transistor according to claim 64 wherein said substrate is formed of silicon carbide selected from the group consisting of 6H, 4H, 15R or 3C silicon carbide and said epitaxial layer is formed of silicon carbide selected from the group consisting of 6H, 4H, 15R or 3C silicon carbide.

66. A high power, high frequency, metal-semiconductor field-effect transistor comprising:

a bulk single crystal silicon carbide substrate;

an epitaxial layer of n-type conductivity silicon carbide upon said substrate, wherein said substrate and said epitaxial layer form a mesa having sidewalls extending downward from said epitaxial layer into said substrate which define the periphery of said transistor;

two separate well regions in said epitaxial layer that are respectively defined by higher n-type carrier concentrations than are present in the remainder of said epitaxial layer;

ohmic contacts upon said well regions in said epitaxial layer for respectively defining one of said well regions as the source and the other of said well regions as the drain;

a Schottky metal contact upon a portion of said epitaxial layer that is between said ohmic contacts and thereby between said source and said drain for forming an active channel in said epitaxial layer between said source and said drain when a bias is applied to said Schottky metal contact; and a conducting plane formed on said substrate opposite said epitaxial layer.

67. A transistor according to claim 66 wherein said substrate is formed of silicon carbide selected from the group consisting of 6H, 4H, 15R or 3C silicon carbide and said epitaxial layer is formed of silicon carbide selected from the group consisting of 6H, 4H, 15R or 3C silicon carbide.

* * * * *

UNITED STATES PATENT AND TRADEMARK OFFICE
CERTIFICATE OF CORRECTION

PATENT NO. : 5,270,554
DATED : December 14, 1993
INVENTOR(S) : Palmour

It is certified that error appears in the above-identified patent and that said Letters Patent is hereby corrected as shown below:

Title page, item [56],

UNDER "OTHER PUBLICATIONS":

In Publication No. 1, after "1988" insert -- Characterization of device parameters in high-temperature metal-oxide-semiconductor field-effect transistors in $\beta$-SiC thin films --

In Column 1, line 28, "field effect" should be -- field-effect --

In Column 1, line 36, "field effect" should be -- field-effect --

In Column 1, line 52, "transistors" should be -- transistor's --

In Column 2, line 21, "field effect" should be -- field-effect --

In Column 3, line 56, after "is" insert -- a --

In Column 5, line 32, "use" should be -- used --

In Column 6, line 6, after "layer" insert a semicolon (;)

In Column 6, line 7, after "however" insert a comma (,)

In Column 6, line 41, "Ion" should be -- on --

UNITED STATES PATENT AND TRADEMARK OFFICE
CERTIFICATE OF CORRECTION

PATENT NO. : 5,270,554
DATED : December 14, 1993
INVENTOR(S) : Palmour

It is certified that error appears in the above-identified patent and that said Letters Patent is hereby corrected as shown below:

In Column 6, line 55, "an" should be -- a --

In Column 6, line 58, "sufficient" should be -- sufficiently --

In Column 8, line 32, after "able" insert a semicolon (;)

In Column 8, line 64, before "used" insert -- be --

In Column 8, line 65, "illustrated" should be -- illustrates --

In Column 11, line 4, "db" should be -- dB --

In Column 11, line 49, "form" should be -- from --

In Column 11, line 53, "complimentary" should be -- complementary --

In Column 12, line 51, "complimentary" should be -- complementary --

In Column 12, line 63, "plate" should be -- plane --

In Column 13, line 49, "where" should be -- wherein --

In Column 13, line 54, "where" should be -- wherein --

UNITED STATES PATENT AND TRADEMARK OFFICE
CERTIFICATE OF CORRECTION

PATENT NO. : 5,270,554
DATED : December 14, 1993
INVENTOR(S) : Palmour

It is certified that error appears in the above-identified patent and that said Letters Patent is hereby corrected as shown below:

In Column 14, line 9, "complimentary" should be
-- complementary --

In Column 14, line 41, "where" should be -- wherein --

In Column 14, line 46, "where" should be -- wherein --

In Column 14, line 51, "where" should be -- wherein --

In Column 15, line 7, "plate" should be -- plane --

In Column 15, line 9, "Transistor" should be
-- A transistor --

In Column 15, line 11, "complimentary" should be
-- complementary --

In Column 15, line 57, before "bulk" insert -- a --

In Column 16, line 15, after "layer" insert -- of --

Signed and Sealed this

Seventh Day of June, 1994

Attest:

BRUCE LEHMAN

*Attesting Officer*     *Commissioner of Patents and Trademarks*